United States Patent
Sanvoisin

(10) Patent No.: US 9,722,921 B2
(45) Date of Patent: Aug. 1, 2017

(54) ENCODING METHOD AND DECODING METHOD FOR A LIST OF IDENTIFIERS, ASSOCIATED COMPUTER PROGRAM PRODUCTS, TRANSMITTER AND RECEIVER APPLYING SAID METHODS

(71) Applicant: THALES, Neuilly sur Seine (FR)

(72) Inventor: Patrick Sanvoisin, Gennevilliers (FR)

(73) Assignee: THALES, Neuilly sur Seine (FR)

( * ) Notice: Subject to any disclaimer, the term of this patent is extended or adjusted under 35 U.S.C. 154(b) by 288 days.

(21) Appl. No.: 14/575,347

(22) Filed: Dec. 18, 2014

(65) Prior Publication Data

US 2015/0172179 A1   Jun. 18, 2015

(30) Foreign Application Priority Data

Dec. 18, 2013  (FR) .................... 13 02989

(51) Int. Cl.
| | |
|---|---|
| H04L 12/12 | (2006.01) |
| H04L 12/741 | (2013.01) |
| H04L 12/721 | (2013.01) |
| H04W 40/02 | (2009.01) |
| H03M 7/30 | (2006.01) |
| H04L 29/12 | (2006.01) |

(52) U.S. Cl.
CPC .......... *H04L 45/54* (2013.01); *H03M 7/3088* (2013.01); *H04L 45/566* (2013.01); *H04L 45/745* (2013.01); *H04W 40/02* (2013.01); *H04L 61/35* (2013.01)

(58) Field of Classification Search
CPC ........................... H04L 45/54; H04L 43/0829
USPC ....................................................... 370/329
See application file for complete search history.

(56) References Cited

U.S. PATENT DOCUMENTS

2013/0176897 A1*  7/2013  Wang ................... H04W 12/06
                                                     370/254

FOREIGN PATENT DOCUMENTS

| EP | 1093250 A1 | 4/2001 |
|---|---|---|
| WO | 0246938 A2 | 6/2002 |
| WO | 2008063012 A1 | 5/2008 |

OTHER PUBLICATIONS

Search Report for French Patent Application No. FR 13 02989 dated Sep. 15, 2014.

(Continued)

*Primary Examiner* — Dang Ton
(74) *Attorney, Agent, or Firm* — Thompson Coburn LLP

(57) ABSTRACT

This method (100) for encoding a list of identifiers in a network including a transmitter including a global list of identifiers and able to transmit a code corresponding to a coded list of identifiers, comprises the following steps:
associating (105) with each identifier an ordinal number;
ordering the list of identifiers in order to obtain a sorted list;
defining (120) a variable equal to the number of identifiers in the list to be transmitted;
if the variable is positive (125), coding (130, 135) the first identifier of the sorted list with a code corresponding to the number of sub-sets of the global list of cardinal equal to the number of identifiers of the sorted list and including at least one identifier, for which the ordinal number is in a strict order relationship with the ordinal number of the first identifier, removing (140) this identifier from the sorted list;
coding (145) the list with the sum of the obtained codes.

8 Claims, 4 Drawing Sheets

(56) References Cited

OTHER PUBLICATIONS

Knuth, Donald E., "A Draft of Section 7.2.1.3: Generating All Combinations", The Art of Computer Programming, Aug. 2003, pp. 1-61, Addison-Wesley.

* cited by examiner

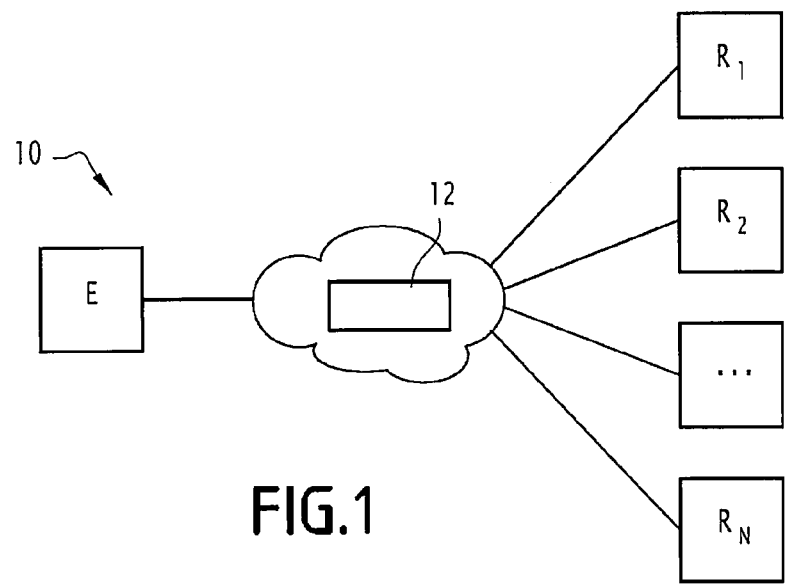
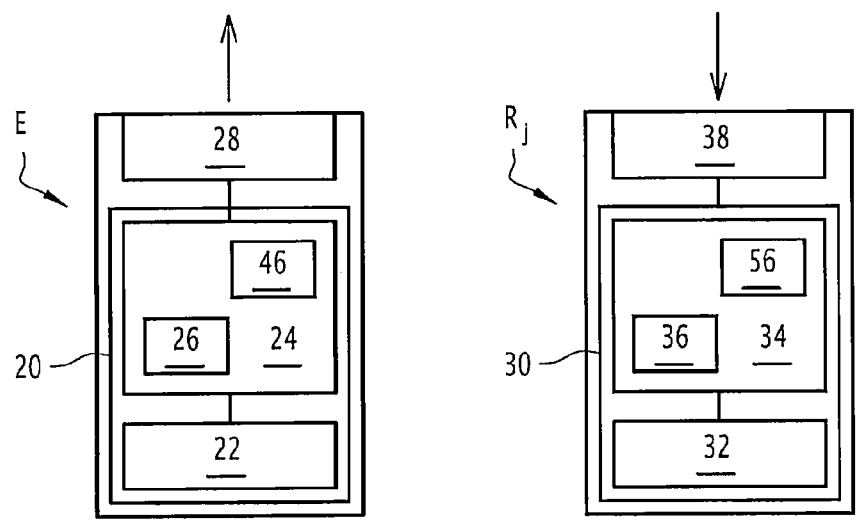
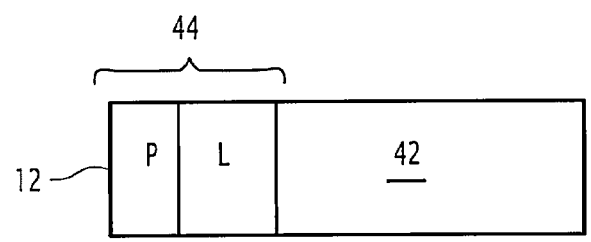
FIG.1
FIG.2
FIG.3
FIG.4

| Code | 1st identifier | 2nd identifier | 3rd identifier |
|---|---|---|---|
| 0 | 7 | 6 | 5 |
| 1 | 7 | 6 | 4 |
| 2 | 7 | 6 | 3 |
| 3 | 7 | 6 | 2 |
| 4 | 7 | 6 | 1 |
| 5 | 7 | 5 | 4 |
| 6 | 7 | 5 | 3 |
| 7 | 7 | 5 | 2 |
| 8 | 7 | 5 | 1 |
| 9 | 7 | 4 | 3 |
| 10 | 7 | 4 | 2 |
| 11 | 7 | 4 | 1 |
| 12 | 7 | 3 | 2 |
| 13 | 7 | 3 | 1 |
| 14 | 7 | 2 | 1 |
| 15 | 6 | 5 | 4 |
| 16 | 6 | 5 | 3 |
| 17 | 6 | 5 | 2 |
| 18 | 6 | 5 | 1 |
| 19 | 6 | 4 | 3 |
| 20 | 6 | 4 | 2 |
| 21 | 6 | 4 | 1 |
| 22 | 6 | 3 | 2 |
| 23 | 6 | 3 | 1 |
| 24 | 6 | 2 | 1 |
| 25 | 5 | 4 | 3 |
| 26 | 5 | 4 | 2 |
| 27 | 5 | 4 | 1 |
| 28 | 5 | 3 | 2 |
| 29 | 5 | 3 | 1 |
| 30 | 5 | 2 | 1 |
| 31 | 4 | 3 | 2 |
| 32 | 4 | 3 | 1 |
| 33 | 4 | 2 | 1 |
| 34 | 3 | 2 | 1 |

FIG.5

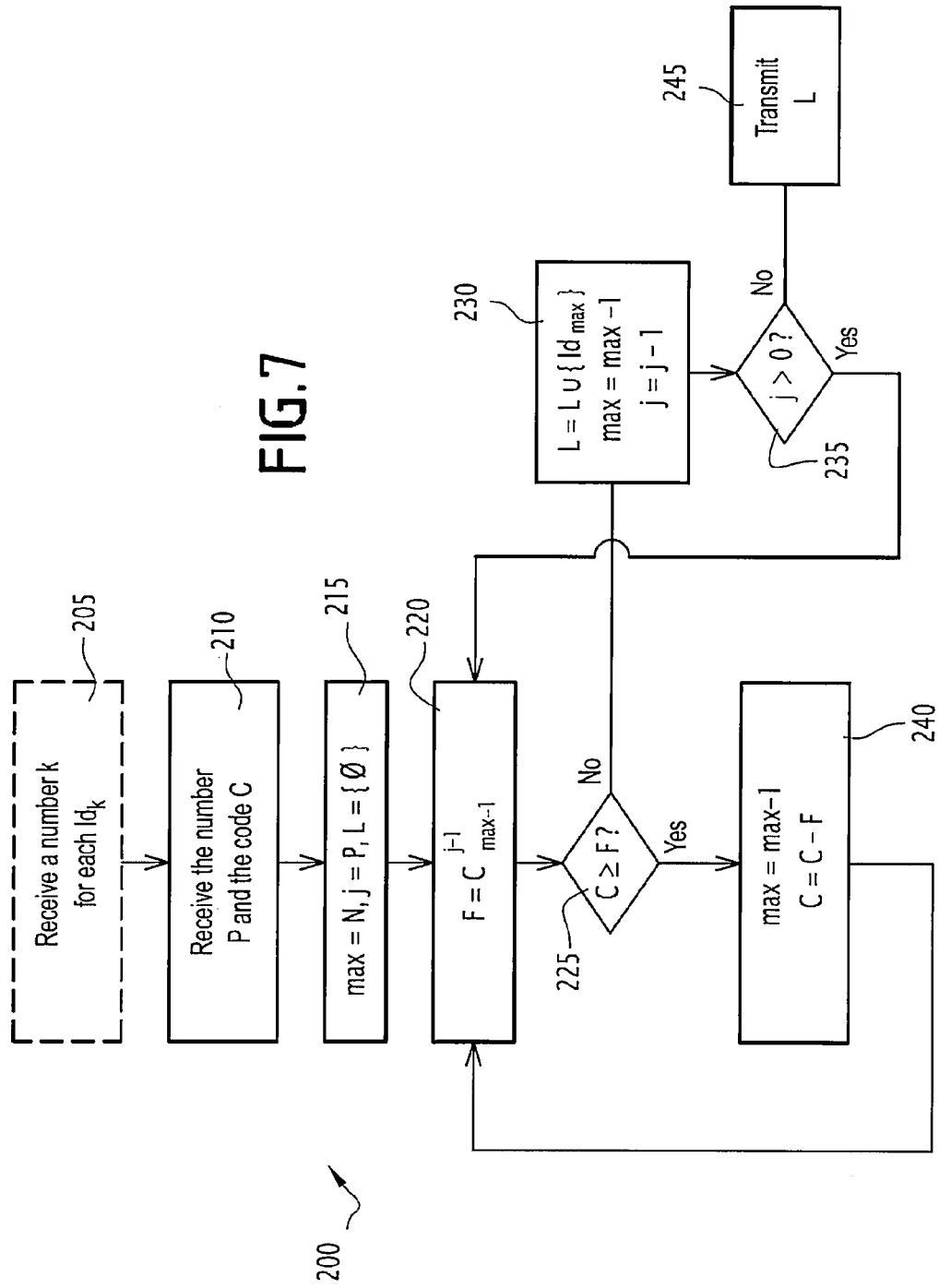

ENCODING METHOD AND DECODING METHOD FOR A LIST OF IDENTIFIERS, ASSOCIATED COMPUTER PROGRAM PRODUCTS, TRANSMITTER AND RECEIVER APPLYING SAID METHODS

FIELD OF THE INVENTION

The present invention relates to a method for encoding a list of identifiers which may be used in a computer network, the computer network including at least one transmitter and at least one receiver, said or each transmitter and said or each receiver including a same global list of different identifiers, each identifier having a technical characteristic, said or each transmitter being able to transmit a data packet intended for one or several different receivers, each data packet including at least one code corresponding to a coded list of identifiers, in which each identifier is present at most once.

In the field of telecommunications or information technology, it is often necessary to transmit a list of identifiers, all different, belonging to a larger set of known identifiers.

BACKGROUND OF THE INVENTION

Such a transmission is for example necessary, when a transmitter transmits a data packet common for a plurality of receivers. In this case, the list of identifiers of these receivers is generally included in the header of the data packet to be transmitted and this header is then transmitted to the whole of the receivers of the computer network.

Upon receiving this header, each receiver extracts the list of identifiers from it and if its identifier is in the list, this receiver continues to receive the data packet entirely. In the opposite case, the receiver ignores the reception of the packet or transmits it to another receiver without having read it.

In computer networks of large dimensions, the identifier of a receiver is generally represented by a number with a significant length or by a complex combination of numbers and letters or other symbols. The size of the header of a data packet including a list of such identifiers therefore becomes very substantial and sometimes exceeds the size of the remainder of the packet. This notably leads to an overload of the computer network.

Different transmission techniques allowing reduction in the size of such a list of identifiers exist in the state of the art.

Notably, it is common to encode a list of identifiers, all different, belonging to a larger set of known identifiers.

Coding theory shows moreover that the minimum number of bits required for transmitting a list of identifiers belonging to a larger set of identifiers is equal to the following expression:

$$N_B = \lceil \log_2 C_N^P \rceil$$

with $\lceil . \rceil$ referring to the excess integer portion, $N_B$ referring to the number of bits, P referring to the number of addressees, N referring to the total number of receivers, and $C_N^P$ referring to the number of sub-sets of cardinal P, in a set with cardinal N.

Optimum encoding is an encoding giving the possibility of obtaining a code length of this size. Optimum encoding therefore gives a minimum theoretical size code for a list of identifiers belonging to a larger set of identifiers. This minimum theoretical size in particular allows efficient transmission of a list of identifiers even in a computer network of a large size.

However, this solution is not completely satisfactory.

Notably, the use of optimum encoding generally requires maintaining in the memory of the transmitter and of each receiver a coding table including all the matches between the codes and the identifiers. The size of this table is very large even for a computer network of a reasonable size.

SUMMARY OF THE INVENTION

The object of the present invention is to propose an optimum encoding method without requiring the maintaining of a coding table in the memory.

For this purpose, the object of the invention is a method for encoding a list of identifiers which may be used in a computer network, comprising the following steps:

associating with each identifier an ordinal number comprised between one and the total number of identifiers in the overall list of identifiers, the number being different for different identifiers;

ordering according to a predetermined strict order relationship, the list of identifiers according to the ordinal number associated with each identifier for obtaining a sorted list of identifiers;

defining a first integer variable equal to the number of the identifiers in the list of identifiers to be transmitted, initializing a previous sorted list of identifiers by the sorted list of identifiers;

as long as the first variable is greater than zero, coding the first identifier of the previous sorted list of identifiers with an elementary code corresponding to the number of sub-sets of the overall list of identifiers with a cardinal equal to the number of identifiers of the previous sorted list of identifiers and including at least one identifier, for which the associated ordinal number is in a predetermined strict order relationship with the ordinal number associated with the first identifier of the previous sorted list of identifiers, removing this identifier from the previous sorted list of identifiers in order to obtain a subsequent sorted list of identifiers, and decrementing by one the first variable;

coding the list of identifiers with a code corresponding to the sum of all the obtained elementary codes.

According to other advantageous aspects of the invention, the method for encoding a list of identifiers comprises a following characteristic:

a first ordinal number is in a predetermined strict order relationship with a second ordinal number when the first ordinal number is strictly greater than the second ordinal number;

it further includes the following steps:

defining an intermediate maximum value equal to the total number of identifiers in the overall list of identifiers;

varying a second integer variable between the ordinal number of the first identifier of the previous sorted list of identifiers and the intermediate maximum value decremented by one;

for each value of the second variable, calculating the number of sub-sets with a cardinal equal to the first variable decremented by one, in a set with a cardinal equal to the second variable;

computing an elementary code corresponding to the first identifier of the previous sorted list of identifiers such as the sum of said numbers of sub-sets, i.e.:

$$C_j = \sum_{i=k_1}^{max-1} C_i^{j-1}$$

with $k_1$ referring to the number associated with the first identifier, i referring to said second variable, max referring to said maximum value, $C_i^{j-1}$ referring to said number of sub-sets, and $C_j$ referring to said elementary code, setting the intermediate maximum value equal to the number associated with the first identifier decremented by one.

The object of the invention is also a computer program product including software instructions which, when they are applied with a computer, apply the encoding method as defined above.

The object of the invention is also a transmitter for a computer network, the computer network including at least one receiver, the transmitter and said or each receiver including a first overall list of different identifiers, each identifier having a technical characteristic, the transmitter being able to transmit a data packet intended for one or several different receivers, each data packet including at least one code corresponding to a coded list of identifiers, wherein each identifier is present at most once, the transmitter including an encoding module capable of:

associating with each identifier, an ordinal number comprised between one and the total number of identifiers in the overall list of identifiers, the number being different for different identifiers;

ordering according to a predetermined strict order relationship, the identifier list according to the ordinal number associated with each identifier for obtaining a sorted list of identifiers;

defining a first integer variable equal to the number of identifiers in the list of identifiers to be transmitted, initializing a previous sorted list of identifiers with the sorted list of identifiers;

as long as the first variable is greater than zero, coding the first identifier of the previous sorted list of identifiers with an elementary code corresponding to the number of sub-sets of the overall list of identifiers with a cardinal equal to the number of identifiers of the previous sorted list of identifiers and including at least one identifier, the associated ordinal number of which is in a predetermined strict order relationship with the ordinal number associated with the first identifier of the previous sorted list of identifiers, removing this identifier from the previous sorted list of identifiers in order to obtain a following sorted list of identifiers, and decrementing by one the first variable;

coding the list of identifiers with a code corresponding to the sum of all the obtained elementary codes.

The object of the invention is also a method for decoding a list of identifiers which may be used in a computer network, the computer network including at least one transmitter and at least one receiver, said or each transmitter and said or each receiver including a same overall list of different identifiers, each identifier having a technical characteristic, said or each transmitter being able to transmit a data packet intended for one or several different receivers, each data packet including at least one code corresponding to a coded list of identifiers, wherein each identifier is present at most only once, the method including the following steps:

associating with each identifier an ordinal number comprised between one and the number of identifiers in the overall list of identifiers, the number being different for different identifiers;

receiving a number corresponding to the number of identifiers in the list of identifiers to be decoded, and a code corresponding to this list of identifiers;

defining an intermediate maximum value equal to the total number of receivers and a first integer variable equal to the number of identifiers in the list of identifiers to be decoded;

computing the number of sub-sets of a cardinal equal to the first variable decremented by one, in a set with a cardinal equal to the intermediate maximum value decremented by one;

if the value of the code is less than said number of sub-sets, adding in the list of identifiers the identifier with an ordinal number equal to the intermediate maximum value, decrementing the intermediate maximum value and the first value by one;

if the value of the code is greater than or equal to said number of sub-sets, decrement the intermediate maximum value by one and compute a new value of the code equal to the difference between the present value of the code and said number of sub-sets.

The object of the invention is also a computer program product including software instructions which, when they are applied with a computer, apply the decoding method as defined above.

The object of the invention is also a receiver for a computer network, the computer network including at least one transmitter, said or each transmitter and the receiver including a same overall list of different identifiers, each identifier having a technical characteristic, said or each transmitter being able to transmit a data packet intended for one or several different receivers, each data packet including at least one code corresponding to a coded list of identifiers, wherein each identifier is at most present only once, the receiver including a decoding module capable of:

associating with each identifier an ordinal number comprised between one and the number of identifiers in the overall list of identifiers, the number being different for different identifiers;

receiving a number corresponding to the number of identifiers in the list of identifiers to be decoded, and a code corresponding to this list of identifiers;

defining an intermediate maximum value equal to the total number of receivers and a first integer variable equal to the number of identifiers in the list of identifiers to be decoded;

computing the number of sub-sets with a cardinal equal to the first variable decremented by one, in a set with a cardinal equal to the intermediate maximum value decremented by one;

if the value of the code is less than said number of sub-sets, adding in the list of identifiers the identifier with an ordinal number equal to the intermediate maximum value, decrementing the intermediate maximum value and the first variable by one;

if the value of the code is greater than or equal to said number of sub-sets, decrementing the intermediate maximum value by one and computing a new value of the code equal to the difference between the present value of the code and said number of sub-sets.

BRIEF DESCRIPTION OF THE DRAWINGS

These features and advantages of the invention will become apparent upon reading the description which follows, only given as a non-limiting example, and made with reference to the appended drawings, wherein:

FIG. 1 is a schematic view of a computer network including a transmitter according to the invention and a plurality of receivers according to the invention;

FIG. 2 is a schematic view of the transmitter of FIG. 1;

FIG. 3 is a schematic view of the receiver of FIG. 1;

FIG. 4 is a schematic view of a data packet able to be produced by the transmitter of FIG. 2 to be transmitted to the receiver of FIG. 3;

FIG. 5 is a schematic view of a coding table according to the invention including 3 columns and 35 lines;

FIG. 7 is a flow chart of a decoding method according to the invention applied by a decoding software package which is part of the receiver of FIG. 3.

DETAILED DESCRIPTION OF THE INVENTION

Figure 6:
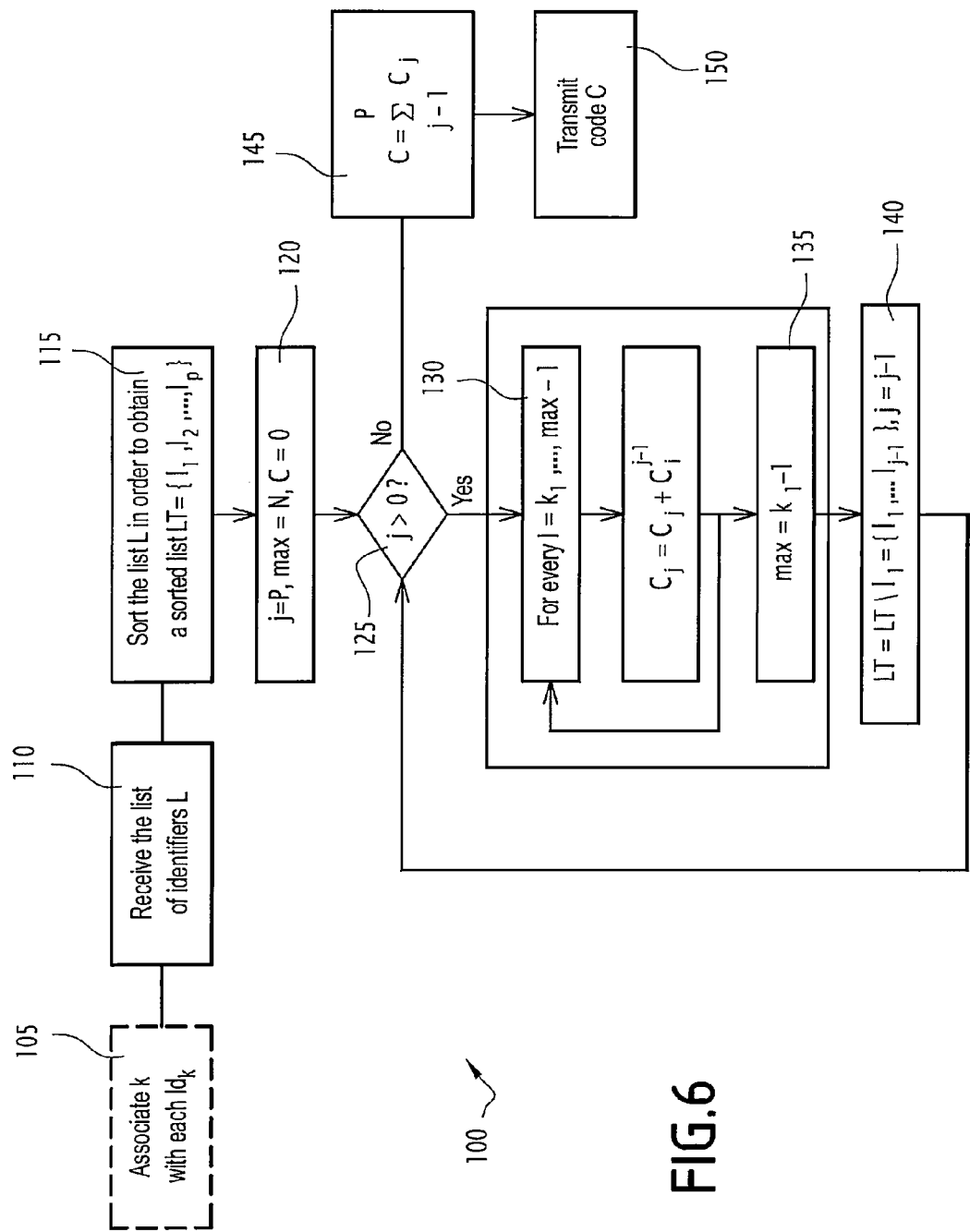
FIG. 6 is a flow chart of an encoding method according to the invention, applied by an encoding software package which is part of the transmitter of FIG. 2.

A computer network 10 is illustrated in FIG. 1. The computer network 10 includes a transmitter E according to the invention and a plurality of receivers $R_1$ to $R_N$ according to the invention, the total number of receivers $R_1$ to $R_N$ being equal to N.

Alternatively, the computer network 10 includes several transmitters E.

Said or each transmitter E is for example a piece of electronic equipment such as a computer, a portable telephone or any other means capable of sending a packet 12 of digital data to one or several receivers $R_1$ to $R_N$. In the following of the description, the number of addressees corresponding to the number of receivers $R_1$ to $R_N$ for which the packet 12 is intended will be referred to by P.

The architecture of the transmitter E is illustrated in FIG. 2. Thus, as illustrated in this FIG. 2, the receiver E includes a data processing unit 20.

The data processing unit 20 is for example formed with a processor 22 and a memory 24 associated with this processor 22.

The processor 22 is able to execute a plurality of software packages which the memory 24 is able to store.

Thus, for example, the memory 24 is able to store a data generation software package 26. Such a software package 26 is able for example to generate digital data intended for P receivers $R_1$ to $R_N$.

The transmitter E further includes a transmission unit 28 connected to the data processing unit 20. The transmission unit 28 is able to form a data packet 12 corresponding to the digital data generated by the software package 26 and to transmit this packet 12 in the computer network 10.

Each receiver $R_1$ to $R_N$ is for example a piece of electronic equipment such as a computer, a portable telephone or any other means able to receive a data packet 12 from said or each transmitter E.

The architecture of a receiver $R_j$ is illustrated in FIG. 3. Thus, as illustrated in this FIG. 3, the receiver $R_j$ includes a data processing unit 30.

The unit 30 is for example formed with a processor 32 and a memory 34 associated with this processor 32.

The processor 32 is able to execute a plurality of software packages which the memory 34 is able to store.

Thus, for example, the memory 34 is able to store a data consumption software package 36.

The receiver $R_j$ further includes a reception unit 38 connected to the data processing unit 30. The reception unit 38 is able to receive each data packet 12 transmitted in the computer network 10 by said or each transmitter E and of transmitting the corresponding digital data towards the software package 36 which is then able to consume these received data 12.

The architecture of all the other receivers $R_1$ to $R_N$ is similar to that of the receiver $R_j$.

Each receiver $R_1$ to $R_N$ includes a single identifier $Id_k$ in the computer network 10, the identifiers $d_k$ are all different. This identifier $Id_k$ gives the possibility of distinguishing in an exclusive and sure way each receiver $R_1$ to $R_N$.

Each identifier $Id_k$ is for example a positive integer.

Alternatively, each identifier $Id_k$ is a succession of numbers and/or letters or other acceptable symbols by the computer network 10.

In both cases, each identifier $Id_k$ is able to be associated with an integer k comprised between 1 and N, the number k being different for different identifiers $Id_k$.

Thus, for example, the number k is the number of the identifier $Id_k$ in an ordered list including the whole of the identifiers $Id_k$ of the computer network 10.

Such an association is able to be known by said or each transmitter E and by the whole of the receivers $R_1$ to $R_N$ before any transmission.

Alternatively, this association is able to be defined in a construction phase of the network 10.

The structure of the data packet 12 is illustrated in detail in FIG. 4.

Thus, as illustrated in this FIG. 4, the data packet 12 is formed with an application message 42 and a header 44. Such a data packet 12 is able to be generated by the transmission unit 28 of said or each transmitter E and be received by the reception unit 38 of each receiver $R_1$ to $R_N$.

The application message 42 comprises digital data generated by the data generation software package 26 and intended for one or several receivers $R_1$ to $R_N$.

The header 44 comprises any auxiliary information allowing transmission of the packet 12 to the corresponding addressee via the computer network 10.

Thus, in the exemplary embodiment illustrated in FIG. 4, the header 44 includes the number P of addresses and a coded list L of identifiers of receivers $R_1$ to $R_N$ for which this packet 12 is intended.

Such a list of identifiers L for example allows the transmitter E to transmit the packet 12 in the computer network 10 without any explanatory forwarding specificity.

Each receiver $R_1$ to $R_N$ is therefore able to receive at least the header 44 of each transmitted packet 12. Thus, the reception unit 38 of the corresponding receiver is able to read the list of identifiers L and, if its identifier $Id_k$ is in the list, to continue reception of the packet 12. In the opposite case, the receiver is able to ignore the reception of the packet 12 or to transmit it to another receiver $R_1$ to $R_N$.

The list of identifiers L is encoded with a code C in order to minimise its size. The size of the list of identifiers L is measured as the number $N_B$ of bits which this list occupies in the header 44.

For this purpose, the memory 24 of the transmitter E is able to further store an encoding software package 46 giving the possibility of encoding the list of identifiers L for each packet 12 transmitted by this transmitter E.

Alternatively, such an encoding is ensured by an independent encoding module which is part of said or each transmitter E.

Similarly, the memory 34 of each receiver $R_1$ to $R_N$ is able to further store a decoding software package 56 giving the possibility of decoding the code C of each packet 12 received by the reception unit 38 of this receiver $R_1$ to $R_N$ in order to obtain the corresponding list of identifiers L.

Alternatively, such decoding is ensured by an independent decoding module which is part of each receiver $R_1$ to $R_N$.

The operation of the encoding software package 46 of the transmitter E will be explained from now on.

The encoding software package 46 is applied by a method 100 for encoding a list of identifiers according to the invention.

This encoding method is based on a coding table Tp for each number p of identifiers of the list of identifiers L.

Thus, for a relevant data packet 12, such a coding table Tp is formed with a plurality of columns of P in number and a plurality of lines with a number equal to the number of sub-sets of cardinal P in a set of cardinal N, i.e.:

$$[Tp] = C_N^P \times P$$

wherein [Tp] refers to the dimensions of the table Tp.

Each line of table Tp is numbered from 0 to $C_N^P - 1$ and is formed with a list of identifiers L including P different identifiers $Id_k$. Each identifier $Id_k$ thus corresponds to a column.

In the subsequent description, a global ordered list of identifiers including the whole of the identifiers $Id_k$ of the computer network 10, sorted in a decreasing order of the number k associated with each identifier $Id_k$ will be referred to by LG.

The coding table Tp is constructed in a single way for N receivers and P addressees according to a law described below.

This law uses certain properties of Pascal's triangle. In particular, the following relationship:

$$C_N^P = \sum_{q=P-1}^{N-1} C_q^{P-1}.$$

gives the possibility of constructing the first column of the Tp with N−P+1 different identifiers.

More particularly, the $C_{N-1}^{P-1}$ first lines of the first column of the table Tp are filled with the first identifier $Id_k$ of the overall list of identifiers LG.

The $C_{N-2}^{P-1}$ following lines of the first column are filled with the second identifier $Id_k$ of the overall list of identifiers LG.

Finally, the last line of the first column corresponding to the number $C_{N-1}^{P-1}$ is filled with the identifier $Id_k$ having the N−P+1 position in the overall list of identifiers LG.

Thus, all the $C_N^P$ lines of the table are filled with N−P+1 different identifiers.

The second column of the table Tp is similarly constructed by removing the first identifier $Id_k$ from the overall list of identifiers LG and by decrementing by one the numbers N and P.

The other columns are obtained by applying the same recursive rule.

By using combinatorial analysis, it is possible to prove that the thereby constructed coding table Tp includes all the different possible lists L including P different identifiers from among N identifiers of the network 10.

Thus, the number of each line exclusively determines the corresponding list of identifiers L. The encoding software package 46 then associates a code C equal to the number of the line with each list of identifiers L including P identifiers.

Accordingly, the number of bits $N_B$ required for transmitting this code C in the header 44 is equal to the excess integer part of the logarithm to base two of the number of sub-sets of cardinal equal to the number of addressees p, in a set with a cardinal equal to the total number of receivers N, i.e., $$N_B = \lceil \log_2 C_N^P \rceil.$$

This notably means that the encoding with the coding table Tp is optimum encoding and that no other encodings exist which give the possibility of obtaining a code C of smaller size.

An example of a coding table Tp for N=7 and P=3 is illustrated in FIG. 5. In this example, each identifier $Id_k$ corresponds to an integer ranging from 1 to 7. Each associated number k is simply equal to the corresponding identifier $Id_k$.

Thus, in the example of FIG. 5, the code c for a list of identifiers including the identifiers <<5>>, <<3>> and <<1>> is equal to <<29>>. The number of bits $N_B$ required for transmitting this code C is equal to 6 bits.

The encoding method 100 gives the possibility of obtaining a code C from a list of identifiers L including P identifiers corresponding to the number of the line including this list L in the corresponding coding table Tp, this being achieved without explicit construction of the table Tp and without requiring it to be maintained in memory.

The flow chart of the encoding method 100 applied by the processing unit 30, is illustrated in FIG. 6. It is applied, on the fly, during each transmission of a packet 12.

During a preliminary step 105, the encoding software package 46 associated with each identifier $Id_k$ an integer k comprised between one and the total number of receivers N, the number k being different for different identifiers $Id_k$.

This step 105 is for example carried out in the construction phase of the computer network 10. The results of this association are then transmitted to the whole of the receivers $R_1$ to $R_N$ of the computer network 10.

During the step 110, the encoding software package 46 receives from the data generation software package 26, a list of identifiers L including P identifiers $Id_k$.

During step 115, the encoding software package 46 sorts the list of identifiers L in a decreasing order of the number k associated with each identifier $Id_k$ in order to obtain a sorted list of identifiers LT.

This sorted list of identifiers LT is therefore ordered and has the following form:

$$LT = \{l_1, l_2, \ldots, l_P\}$$

wherein each $l_j$ corresponds to an identifier $Id_k$ from the list of identifiers L ordered according to the decreasing order of the number k.

During step 120, the encoding software package 46 defines a first integer variable j equal to the number of addresses P, an intermediate maximum value max☐ equal to the total of receivers N, i.e.:

j=P, max=N.

In the same step, the encoding software package 46 resets the code C to zero.

As long as the first variable j is greater than zero during the step 125, the encoding software package 46 skips to step 130.

During the step 130, the encoding software package 46 varies a second integer variable i between the number $k_1$ associated with the first identifier $l_1$ from the sorted list of identifiers LT and the intermediate maximum value max☐ decremented by one.

In this step 130, the encoding software package 46 for each value of the second variable i, computes the number of sub-sets of cardinal equal to the first variable j decremented by one, in a set of cardinal equal to the second variable i.

The encoding software package 46 moreover computes an elementary code $C_j$ corresponding to the first identifier $l_1$ of the sorted list of identifiers LT like the sum of the numbers of sub-sets, i.e.:

$$C_j = \sum_{i=k_1}^{max-1} C_i^{j-1}.$$

During the step 135, the encoding software package 46 sets the intermediate maximum value max equal to the number $k_1$ associated with the first identifier $l_1$, decremented by one, i.e.:

max=$k_1$-1.

During the step 140, the encoding software package 46 removes the identifier $l_1$ from the sorted list of identifiers LT and decrements by one the first variable j, i.e.:

LT'=LT\$l_1$={$l_2$, ... $l_j$}, j'=j-1.

The encoding software package 46 changes the names of variables in the list LT' without dropping the latter, so as to obtain a following list:

LT'={$l_1$, ... $l_{j-1}$}.

The encoding software package 46 updates the list LT and the variable j' in this way:

LT=LT', j=j'.

And then the encoding software package 46 returns to the step 125.

If during step 125, the first variable j is equal to zero, the encoding software package 46 skips to step 145.

In other words, during previous steps, as long as the first variable j is greater than zero, the encoding software package codes the first identifier $l_1$ from the sorted list of identifiers LT with an elementary code $C_j$ corresponding to the number of sub-sets of the global list LG of identifiers of cardinal equal to the number of identifiers $Id_k$ of the sorted list of identifiers LT, each sub-set being sorted in a decreasing order of the number k associated with each identifier $Id_k$ and including in the first position an identifier $Id_k$ with an associated number k greater than the number k associated with the first identifier $l_1$ of the sorted list of identifiers LT, remove this identifier $l_1$ from the sorted list of identifiers LT and decrement by one the first variable j.

During the step 145, the encoding software package 46 computes the code C by summing up all the obtained elementary codes $C_j$, i.e.:

$$C = \sum_{j=1}^{P} C_j.$$

During the step 150, the encoding software package 46 transmits the obtained code C to the transmission unit 28.

The operation of the decoding software package 56 applied by the processing unit 30 of each receiver $R_1$ to $R_N$, applied by a method 200 for decoding a list of identifiers according to the invention will be explained from now on.

The flow chart of the decoding method 200 is illustrated in FIG. 7. This method 200 is applied at each reception.

During a preliminary step 205, the decoding software package 56 receives a list including for each identifier $Id_k$ a number k associated with this identifier. Each step 205 is for example carried out in the construction phase of the computer network 10.

During step 210, the decoding software package 56 receives the number of identifiers P and the code C from the reception unit 38.

During step 215, the decoding software package 56 defines an intermediate maximum value max equal to the total number of receivers N and a first integer variable j equal to the number of addressees P, i.e.:

max=N, j=P.

The decoding software package 56 further resets a list of identifiers L with an empty list, i.e.:

L={∅}.

During step 220, the decoding software package 56 computes the number F of sub-sets of cardinal equal to the first variable j decremented by one, in a set with a cardinal equal to the intermediate maximum value max decremented by one, i.e.:

$F=C_{max-1}^{j-1}$.

If during step 225 the value of the code C is less than said number of sub-sets, during step 230, the decoding software package 56 adds in the list of identifiers L the identifier $Id_k$ with an associated number k equal to the intermediate maximum value max, decrements the intermediate maximum value max and the first variable j by one, i.e.:

L=L∪{$Id_{max}$}, max'=max-1, j'=j-1 max=max', j=j'.

If during step 235, the first variable j is greater than zero, the decoding software package 56 returns to step 225.

If during step 225 the value of the code C is greater than or equal to said number of sub-sets, during step 240 the decoding software package 56 decrements the intermediate maximum value max by one and computes a new value of the code equal to the difference between the present value of the code C and said number of sub-sets F, i.e.:

max'=max-1, C'=C-F max=max', C=C'.

The decoding software package 56 then returns to step 220.

If, during step 235, the first variable j is equal to zero, during step 245, the decoding software package 56 transmits the obtained list of identifiers L to the reception unit 38.

The operation of the computer network 10 including a transmitter E according to the invention and N receivers $R_1$ to $R_N$ according to the invention, will be explained from now on.

The data generation software package 26 of the transmitter E generates digital data intended for P receivers $R_1$ to $R_N$.

The software package 26 moreover generates a list of identifiers L including the P identifiers $Id_k$ of the receivers $R_1$ to $R_N$ for which these data are intended.

Next, the encoding software package 46 encodes this list of identifiers L with a code C according to the encoding method for a list of identifiers 100.

The transmission unit 28 then forms a data packet 12 by including therein an application message 42 corresponding to the digital data generated by the software package 26 and a header 44. The header 44 includes the number P and the code C.

The data packet 12 is then transmitted in the computer network 10 by the transmission unit.

Next, this data packet 12 or at least its header 44 is received by the reception unit 38 of each receiver $R_1$ to $R_N$. The unit 38 extracts therefrom the number P and the code C.

The decoding software package 56 then decodes the code C according to the method for decoding a list of identifiers 200, in order to obtain the corresponding list of identifiers L.

If the identifier $Id_k$ of a receiver $R_1$ to $R_N$ is in the list L, the reception unit 38 of this receiver $R_1$ to $R_N$ continues to receive the data packet 12 and transmits the corresponding application message 42 to the data consumption software package 36.

In the opposite case, the reception unit 38 ignores the reception of the packet 12 and/or transmits it to another receiver $R_1$ to $R_N$.

The encoding method 100 and the decoding method 200 then allow encoding and decoding of a list of identifiers L by using an optimum code C without requiring a coding table Tp to be maintained in the memory of said or each transmitter E and of the whole of the receivers $R_1$ to $R_N$. In particular, this allows considerable reduction in the size of the header 44 for each data packet intended for P receivers $R_1$ to $R_N$.

Of course, many other embodiments of the encoding and decoding methods are also possible. Thus, for example in step 115 of the encoding method 100, it is possible to sort each identifier list L to be transmitted in an increasing order of the associated number k. The other steps of the encoding method 100 and of the decoding method 200 are modified in recurrence.

The use of the encoding 100 and decoding 200 methods according to the invention is not exclusively restricted by encoding and decoding of a list of identifiers L in the header of a data packet. Generally, these methods are applicable for encoding and decoding any list of elements including elements of a known set.

The invention claimed is:

1. A method for encoding a list of identifiers which may be used in a computer network, the computer network including at least one transmitter and at least one receiver,
the at least one transmitter and the at least one receiver including a same global list of different identifiers, each identifier having a technical characteristic,
the at least one transmitter being able to transmit a data packet intended for one or several different receivers,
each data packet including at least one code corresponding to a coded list of identifiers, the coded list of identifiers comprising at least one of said identifiers,
the encoding method comprising the following steps:
associating with each identifier an ordinal number comprised between one and the total number of identifiers in the global list of identifiers, the number being different for different said identifiers;
ordering according to a predetermined strict order relationship, the identifier list according to the ordinal number associated with each identifier in order to obtain a sorted list of identifiers;
defining a first integer variable equal to the number of identifiers in the list of identifiers to be transmitted, initializing a previous sorted list of identifiers with the sorted list of identifiers;
as long as the first variable is greater than zero, coding the first identifier of the previous sorted list of identifiers with an elementary code corresponding to the number of sub-sets of the global list of identifiers of cardinal equal to the number of identifiers of the previous sorted list of identifiers and including at least one identifier for which the associated ordinal number is in a predetermined strict order relationship with the ordinal number associated with the first identifier of the previous sorted list of identifiers, removing this identifier from the previous sorted list of identifiers in order to obtain a following sorted list of identifiers, and decrementing by one the first variable;
coding the list of identifiers with a code corresponding to the sum of all the obtained elementary codes.

2. The method according to claim 1, wherein a first ordinal number is in a predetermined strict order relationship with a second ordinal number when the first ordinal number is strictly greater than the second ordinal number.

3. The method according to claim 2, further including the following steps:
defining an intermediate maximum value equal to the total number of identifiers in the global list of identifiers;
varying a second integer variable between the ordinal number of the first identifier of the previous sorted list of identifiers and the intermediate maximum value decremented by one;
for each value of the second variable, computing the number of sub-sets of cardinal equal to the first variable decremented by one, in a set with a cardinal equal to the second variable;
computing an elementary code corresponding to the first identifier of the previous sorted list of identifiers as the sum of said numbers of sub-sets, i.e.:

$$C_j = \sum_{i=k_1}^{max-1} C_i^{j-1}$$

with
$k_1$ referring to the number associated with said first identifier,
i referring to said second variable,
max referring to said maximum value,
$C_i^{j-1}$ referring to said number of sub-sets, and
$C_j$ referring to said elementary code,
setting the intermediate maximum value max equal to the number associated with the first identifier decremented by one.

4. A non-transitory computer readable medium stored within a memory connected to a processor, the processor able to execute a plurality of software packages of the non-transitory computer readable medium stored within the memory which when applied by a computer, apply the encoding method according to claim 1.

5. A transmitter for a computer network, the computer network including at least one receiver,
the transmitter and the at least one receiver including a same global list of different identifiers, each identifier having a technical characteristic,
the transmitter being able to transmit a data packet intended for one or several different receivers,
each data packet including at least one code corresponding to a coded list of identifiers, the coded list of identifiers comprising at least one of said identifiers, the transmitter including an encoding module capable of:
associating with each identifier an ordinal number comprised between one and the total number of identifiers in the global list of identifiers, the number being different for different said identifiers;
ordering according to a predetermined strict order relationship, the list of identifiers according to the ordinal number associated with each identifier in order to obtain a sorted list of identifiers;
defining a first integer variable equal to the number of identifiers in the list of identifiers to be transmitted, initializing a previous sorted list of identifiers with the sorted list of identifiers;
as long as the first variable is greater than zero, coding the first identifier of the previous sorted list of identifiers with an elementary code corresponding to the number of sub-sets of the global list of identifiers of a cardinal equal to the number of identifiers of the previous sorted list of identifiers and including at least one identifier for which the associated ordinal number is in a predetermined strict order relationship with the ordinal number associated with the first identifier of the previous sorted list of identifiers, removing this identifier from the previous sorted list of identifiers in order to obtain a following sorted list of identifiers, and decrementing by one the first variable;
coding the list of identifiers with a code corresponding to the sum of all the obtained elementary codes.

6. A method for decoding a list of identifiers which may be used in a computer network, the computer network including at least one transmitter and at least one receiver,
the at least one transmitter and the at least one receiver including a same global list of different identifiers, each identifier having a technical characteristic,
the at least one transmitter being able to transmit a data packet intended for one or several different receivers,
each data packet including at least one code corresponding to a coded list of identifiers, the coded list of identifiers comprising at least one of said identifiers,
the method comprising the following steps:
associating with each identifier an ordinal number comprised between one and the number of identifiers in the global list of identifiers, the number being different for different said identifiers;
receiving a number corresponding to the number of identifiers in the list of identifiers to be decoded, and a code corresponding to this list of identifiers;
defining an intermediate maximum value equal to the total number of receivers and a first integer variable equal to the number of identifiers in the list of identifiers to be decoded;
computing the number of sub-sets of cardinal equal to the first variable decremented by one, in a set of cardinal equal to the intermediate maximum value decremented by one;
if the value of the code is less than said number of sub-sets, adding in the list of identifiers the identifier with an ordinal number equal to the intermediate maximum value, decrementing the intermediate maximum value and the first variable by one;
if the value of the code is greater than or equal to said number of sub-sets, decrementing the intermediate maximum value by one and computing a new value of the code equal to the difference between the present value of the code and said number of sub-sets.

7. A non-transitory computer readable medium stored within a memory connected to a processor, the processor able to execute a plurality of software packages of the non-transitory computer readable medium stored within the memory which when applied by a computer, apply the decoding method according to claim 6.

8. A receiver for a computer network, the computer network including at least one transmitter,
the at least one transmitter and the receiver including a same global list of different identifiers, each identifier having a technical characteristic,
the at least one transmitter being able to transmit a data packet intended for one or several different receivers,
each data packet including at least one code corresponding to a coded list of identifiers, the coded list of identifiers comprising at least one of said identifiers,
the receiver including a decoding module capable of:
associating with each identifier an ordinal number comprised between one and the number of identifiers in the global list of identifiers, the number being different for different said identifiers;
receiving a number corresponding to the number of identifiers in the list of identifiers to be decoded, and a code corresponding to this list of identifiers;
defining an intermediate maximum value equal to the total number of receivers and a first integer variable equal to the number of identifiers in the list of identifiers to be decoded;
computing the number of sub-sets of cardinal equal to the first variable decremented by one, in a set with a cardinal equal to the intermediate maximum value decremented by one;
if the value of the code is less than said number of sub-sets, adding in the list of identifiers the identifier with an ordinal number equal to the intermediate maximum value, decrementing the intermediate maximum value and the first variable by one;
if the value of the code is greater than or equal to said number of sub-sets, decrementing the intermediate maximum value by one and computing a new value of the code equal to the difference between the present value of the code and said number of sub-sets.

* * * * *